(12) United States Patent
Sasaki et al.

(10) Patent No.: US 11,352,503 B2
(45) Date of Patent: Jun. 7, 2022

(54) POWDER MIXTURE

(71) Applicant: DENKA COMPANY LIMITED, Tokyo (JP)

(72) Inventors: Shuji Sasaki, Omuta (JP); Yuzo Nakamura, Omuta (JP); Kohki Ichikawa, Ueda (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 16/500,042

(22) PCT Filed: Mar. 30, 2018

(86) PCT No.: PCT/JP2018/013956
§ 371 (c)(1),
(2) Date: Oct. 1, 2019

(87) PCT Pub. No.: WO2018/186315
PCT Pub. Date: Oct. 11, 2018

(65) Prior Publication Data
US 2020/0181414 A1 Jun. 11, 2020

(30) Foreign Application Priority Data
Apr. 4, 2017 (JP) .............................. JP2017-074575

(51) Int. Cl.
*C08K 3/22* (2006.01)
*C08K 3/36* (2006.01)
*C08K 7/18* (2006.01)
*C09C 1/00* (2006.01)
*H01L 23/29* (2006.01)

(52) U.S. Cl.
CPC .............. *C09C 1/0081* (2013.01); *C08K 3/22* (2013.01); *C08K 3/36* (2013.01); *C08K 7/18* (2013.01); *H01L 23/295* (2013.01); *C01P 2004/32* (2013.01); *C01P 2004/61* (2013.01); *C01P 2004/62* (2013.01); *C08K 2003/2227* (2013.01); *C08K 2003/2237* (2013.01); *C08K 2201/005* (2013.01); *C08K 2201/014* (2013.01)

(58) Field of Classification Search
CPC .......... C04B 35/468; C04B 2235/3217; C23C 16/402; H01L 23/31; H01L 23/295; H01L 23/29; C09C 1/0081; C09C 1/00; C08K 3/22; C08K 3/36; C08K 7/18; C08K 2003/2227; C08K 2003/2237; C08K 2201/005; C08K 2201/014; C08K 2201/003; C08K 3/10; C08K 3/34; C01P 2004/32; C01P 2004/61; C01P 2004/62; C01P 2004/64; C01P 2002/02; C01B 33/18; C01F 7/02; C01G 23/00; C01G 23/006; H01B 3/006
See application file for complete search history.

(56) References Cited

U.S. PATENT DOCUMENTS

| | | | |
|---|---|---|---|
| 2002/0197461 A1* | 12/2002 | Takaya | C30B 29/30 428/210 |
| 2010/0249279 A1 | 9/2010 | Ogawa et al. | |
| 2017/0121520 A1 | 5/2017 | Tan et al. | |

FOREIGN PATENT DOCUMENTS

| | | | |
|---|---|---|---|
| CN | 106461366 A | 2/2017 | |
| JP | H05-301766 A | 11/1993 | |
| JP | 2005-112665 A | 4/2005 | |
| JP | 2005112665 A * | 4/2005 | |
| JP | 2005119929 A * | 5/2005 | |
| JP | 2013-155071 A | 8/2013 | |
| JP | 2013155071 A * | 8/2013 | ......... C04B 35/4682 |
| JP | 2016003289 A * | 1/2016 | |
| JP | 2017-024925 A | 2/2017 | |
| JP | 2017024925 A * | 2/2017 | |
| JP | 2017-057268 A | 3/2017 | |
| TW | 201035212 A | 10/2010 | |
| WO | 2015/146816 A1 | 10/2015 | |
| WO | 2016/029666 A1 | 3/2016 | |

OTHER PUBLICATIONS

Machine translation of JP-2005112665-A Printed Sep. 29, 2020 (Year: 2005).*
Machine translation of JP-2005119929-A Printed Oct. 7, 2020 (Year: 2005).*
JP-2017024925-A machine translated (Year: 2017).*
JP-2013155071-A machine translated (Year: 2013).*
Mikhailov, M. et al. "Radiation stability of powders in mixtures with Al2O3 nanoparticles" Radiation Effects and Defects in Solids, vol. 168, No. 2, Feb. 2013, 106-114. doi:10.1080/10420150.2012. 693084 (Year: 2013).*
JP-2016003289-A, Nakade machine translation (Year: 2016).*
Jun. 12, 2018 International Search Report issued in International Patent Application No. PCT/JP2018/013956.
Jun. 28, 2021 Office Action issued in Taiwanese Patent Application No. 107111657.
Feb. 18, 2022 Office Action issued in Chinese Patent Application No. 201880023552.0.
Chen, Lijun et al. "Microelectronics Materials and Processing,"Material Technology of Ceramic Packaging, Fudan University Press, pp. 410-412, Mar. 31, 2005.

\* cited by examiner

*Primary Examiner* — Kevin E Yoon
*Assistant Examiner* — Marites A No-O Gui Uzzle
(74) *Attorney, Agent, or Firm* — Oliff PLC

(57) ABSTRACT

A powder mixture including spherical barium titanate particles and spherical oxide particles and having an average particle diameter of 2 µm or more and 30 µm or less, wherein the spherical oxide particles have an average particle diameter of 0.05 µm or more and 1.5 µm or less, and the spherical oxide particles are contained in an amount of 0.02% by mass or more and 15% by mass or less based on the powder mixture. The spherical oxide particles are preferably amorphous silicon dioxide particles and/or aluminum oxide particles. According to the present invention, it is possible to provide a spherical barium titanate-based powder which enables to prepare a high dielectric resin composition with which reduced wire sweep amount and burr are achieved.

2 Claims, No Drawings

POWDER MIXTURE

TECHNICAL FIELD

The present invention relates to a powder mixture.

BACKGROUND ART

In recent years, computerization and networking of information have made great progress, and management of confidential information of companies and individuals has become important. Access management to such confidential information requires a personal authentication function, and in the field requiring a high level authentication function, the fingerprint authentication function is now in widespread use.

Fingerprint authentication includes an optical type, a thermal type, and a capacitance type. In a mobile terminal represented by a smartphone or a tablet, the capacitance type is often adopted from the viewpoints of high reliability, high resolution and miniaturization. Capacitance type needs to detect the difference of capacitance by the fine unevenness of the fingerprint with high accuracy. In order to increase the capacitance of the fingerprint authentication system, there is a demand for increasing the dielectric of a sealing material that protects the fingerprint sensor. Generally, in order to detect a sensor with a general sensitivity level with high accuracy, a relative permittivity of 30 or more is required for the sealing material.

In order to increase the dielectric of the sealing material, it is necessary to use a high dielectric material such as barium titanate as an inorganic filler to be filled in the sealing material and to fill it therein in an amount as large as possible, but the conventional fillers could not fully satisfy the properties. For example, PTL 1 discloses a technique for highly filling an inorganic filler in a resin by combining perovskite type composite oxide particles having different particle sizes. However, in this method, since the granulated powder is fired under the condition that the fusion between particles does not proceed, the unevenness on the surface of the particles is large, and the improvement of the sealing properties is not sufficient. PTL 2 discloses a technique for obtaining a dielectric ceramic particle being spherical and composed of a single crystal by applying heat treatment to a part of the raw material powder after melting, but since the particle size distribution is not controlled, the sealing properties are not enough.

Further, in the recent semiconductor structure, the thinning of the gold wire is in progress, causing a defect called wire sweep, where a wire is deformed by a flow pressure of a semiconductor sealing material at the time of sealing, thereby causing a problematic phenomenon that a defect rate of a semiconductor is increased. On the other hand, if it is attempted to reduce the viscosity of the sealing material in order to improve the wire sweep, a phenomenon in which the sealing material overflows from the air vent portion of the mold (occurrence of burr) becomes remarkable. Therefore, the most advanced high dielectric sealing material is required to have the properties capable of performing sealing without causing a defect such as wire sweep or burr.

CITATION LIST

Patent Literature

PTL 1: JP 2013-155071A
PTL 2: JP 2005-112665A

SUMMARY OF INVENTION

Technical Problem

An object of the present invention is to provide a powder mixture which enables to prepare a high dielectric resin composition with which reduced wire sweep amount and burr are achieved.

Solution to Problem

The present inventors have conducted intensive studies to achieve the above object, and found a powder mixture that achieves this object. The present invention is based on such findings and has the following summary.

(1) A powder mixture including spherical barium titanate particles and spherical oxide particles and having an average particle diameter of 2 μm or more and 30 μm or less, wherein the spherical oxide particles have an average particle diameter of 0.05 μm or more and 1.5 μm or less, and are contained in an amount of 0.02% by mass or more and 15% by mass or less based on the powder mixture.

(2) The powder mixture as set forth in (1), wherein the spherical oxide particles are amorphous silicon dioxide particles and/or aluminum oxide particles.

(3) The powder mixture as set forth in (1) or (2), wherein particles having a particle diameter of 2 μm or more contained in the powder mixture satisfy the following conditions (A) to (C):

(A) an average sphericity is 0.80 or more;
(B) the number percentage of particles having a sphericity of more than 0.70 and 0.75 or less is 10.0% or less; and
(C) the number percentage of particles having a sphericity of 0.70 or less is 10.0% or less.

Advantageous Effects of Invention

According to the present invention, there is provided a powder mixture which enables to prepare a high dielectric resin composition with which reduced wire sweep amount and burr are achieved.

DESCRIPTION OF EMBODIMENTS

Hereinafter, the present invention will be described in detail.

The powder mixture of the present invention needs to have an average particle diameter of 2 μm or more and 30 μm or less. If the average particle diameter is less than 2 μm, the number of fine particles is too large, and when the powder mixture having such an average particle diameter is filled in a resin, the resulting sealing material has an increased viscosity, thereby causing an increased wire sweep amount. On the other hand, if the average particle diameter exceeds 30 μm, the number of coarse particles is too large, and the frequency of collision of these coarse particles with the wire is increased, similarly causing an increased wire sweep amount. The average particle diameter is preferably 3 μm or more and 25 μm or less, and more preferably 4 μm or more and 20 μm or less.

The average particle diameter of the powder mixture of the present invention is a value based on a measurement of particle size on a mass basis by a laser diffraction light scattering method, and is measured using "Mastersizer 3000" with a wet dispersion unit: "Hydro MV", each manufactured by Malvern Panalytical Ltd. In the measurement, water is used as a solvent, and as pretreatment, dispersion treatment is performed by applying an output of 200 W using "ultrasonic generator UD-200 (with a microtip TP-040)" manufactured by Tomy Seiko Co., Ltd. for 2 minutes. The sample powder after the dispersion treatment is dropped to the dispersion unit such that the laser scattering intensity is 10 to 15%. The stirring speed of the dispersion unit stirrer is 1,750 rpm, and the ultrasonic mode is absent. The analysis of the particle size distribution is performed by dividing the range of the particle diameter of 0.01 to 3,500 μm into 100 parts. As the refractive index of water, 1.33 is set, and as the refractive index of the powder mixture, the refractive index of spherical barium titanate particles which is the main component of the powder mixture, 2.40 is set. In the measured particle size distribution, the particle diameter of the particle which has reached 50% in terms of a cumulative mass is designated as the average particle diameter.

The powder mixture of the present invention is required to contain spherical oxide particles having an average particle diameter of 0.05 μm or more and 1.5 μm or less in an amount of 0.02% by mass or more and 15% by mass or less. Since the spherical oxide particles enter into the gaps between the spherical barium titanate particles, which are the main constituent particles, when the powder mixture is filled in a resin, the resulting sealing material has a reduced viscosity, thereby reducing the wire sweep amount. In addition, the particles form a structure close to a close-packed structure, thereby suppressing occurrence of burr. If the average particle diameter of the spherical oxide particles is less than 0.05 μm, the number of fine particles is too large, and when the powder mixture is filled in a resin, the resulting sealing material has an increased viscosity, thereby causing an increased wire sweep amount. On the other hand, if the average particle diameter exceeds 1.5 μm, when the powder mixture is filled in a resin, the effect of reducing the burr of the resulting sealing material becomes insufficient. The average particle diameter of the spherical oxide particles is preferably 0.07 μm or more and 1.3 μm or less, and more preferably 0.1 μm or more and 1.0 μm or less. If the content of the spherical oxide particles is less than 0.02% by mass, the amount of the spherical oxide particles which enter into the gaps between the spherical barium titanate particles is small, and when the powder mixture is filled in a resin, the effect of reducing the burr of the sealing material becomes insufficient. On the other hand, if the content exceeds 15% by mass, the spherical oxide particles become excessive, and the number of particles that can not enter into the gaps of the spherical barium titanate particles is large, and when the powder mixture is filled in a resin, the viscosity of the resulting sealing material is increased, thereby resulting in an increased wire sweep amount. In addition, depending on the composition of the spherical oxide particles, the dielectric property may be deteriorated. The content of the spherical oxide particles is preferably 0.05% by mass or more and 10% by mass or less, and more preferably 0.08% by mass or more and 5% by mass or less.

The composition of the spherical oxide contained in the powder mixture of the present invention will be described. When the spherical oxide particles have a density lower than that of the spherical barium titanate particles which are main constituent particles, the spherical oxide particles can enter into the gaps between spherical barium titanate particles more efficiently, whereby the effects of reducing the wire sweep amount and the burr can be further enhanced when the powder mixture is used for a sealing material. Among oxides having a density lower than that of the spherical barium titanate particles, amorphous silicon dioxide particles and/or aluminum oxide particles are preferable as the spherical oxides from the viewpoints of insulation property and moisture resistance when the powder mixture is used for a sealing material. Amorphous silicon dioxide particles and aluminum oxide particles may be properly used depending on the properties required when used for a sealing material, and specifically, when importance is given to low thermal expansion, amorphous silicon dioxide particles are preferable, and when importance is given to high thermal conductivity, aluminum oxide particles are preferable. In addition, for the purpose of adjusting these properties, both amorphous silicon dioxide particles and aluminum oxide particles may be included.

The content of the spherical oxide particles contained in the powder mixture of the present invention is measured by the following method. The powder mixture is separated into spherical barium titanate particles and spherical oxide particles by specific gravity separation using heavy liquid. The heavy liquid used is selected according to the composition of the spherical oxide particles. When the spherical oxide particles are amorphous silicon dioxide particles, an aqueous solution having a sodium polytungstate concentration of 80% by mass (density: 2.7 g/cm$^3$) is used as the heavy liquid. When the spherical oxide particles are aluminum oxide particles or a mixture of amorphous silicon dioxide particles and aluminum oxide particles, saturated Clerici solution (density: 4.3 g/cm$^3$) is used as the heavy liquid. Specifically, first, 1,440 g of each heavy liquid is added to 160 g of the powder mixture to prepare a slurry having a powder mixture concentration of 10% by mass, and then the slurry is subjected to dispersion treatment for 2 minutes at a power level of 8 using "SONIFIER 450 (crushing horn ¾" solid type)" manufactured by BRANSON. 40 g of the slurry after dispersion treatment is transferred into a centrifuge tube "CT-500B" manufactured by Sanplatec Co., Ltd., and centrifuged at 1,500 G for 30 minutes using a multi-column refrigerated centrifuge "EX-126" manufactured by Tomy Seiko Co., Ltd. to separate into barium titanate particles and spherical oxide particles. After centrifugation for the entire amount of the slurry, the supernatant is collected while washing with acetone and dried at 120° C. for 24 hours. The mass after drying is measured, and the content of the spherical oxide particles in the powder mixture is calculated.

The average particle diameter of the spherical oxide particles contained in the powder mixture of the present invention is measured by the following method using the spherical oxide particles collected from the supernatant of the heavy liquid separation described above. After fixing the spherical oxide particles on a sample table with carbon paste, osmium coating is applied, and an image having a magnification of 50,000 and a resolution of 2,048×1,536 pixels photographed with a scanning electron microscope "JSM-6301F type" manufactured by JEOL Ltd. is captured into a computer. This image is used to recognize a particle using a simple capture tool by using an image analysis device "MacView Ver. 4" manufactured by Mountech Co., Ltd., and a projected area circle equivalent diameter of the particle is measured. After measuring the projected area circle equivalent diameter of each of 1,000 particles, the particle size distribution based on the volume basis is automatically analyzed using the above-mentioned image analysis device, and the particle diameter of 50% of the cumulative volume is calculated and taken as the average particle diameter of the spherical oxide particles.

With respect to a spherical degree of the spherical oxide particles contained in the powder mixture of the present invention, it is preferable that the average sphericity of particles having a particle diameter of 0.05 μm or more is 0.85 or more. According to this, it is possible to reduce the frictional resistance which is caused when the spherical oxide particles enter into the gaps between the spherical barium titanate particles that are the main constituent particles, thereby improving the effect of reducing the wire sweep amount when the powder mixture is used for a sealing material.

The sphericity of the spherical oxide particles contained in the powder mixture of the present invention is measured by the following method using the spherical oxide particles collected from the supernatant of the heavy liquid separation described above. The spherical oxide particles and ethanol are mixed to prepare a slurry of 1% by mass of spherical oxide particles, and the slurry is subjected to dispersion treatment for 2 minutes at a power level of 8 using "SONIFIER 450 (crushed horn ¾" solid type)", manufactured by BRANSON. The dispersed slurry is dropped onto a sample table coated with carbon paste by a dropper. After leaving in the atmosphere until the spherical oxide particles dropped on the sample table are dried, osmium coating is applied, and an image having a magnification of 50,000 and a resolution of 2,048×1,536 pixels photographed with a scanning electron microscope "JSM-6301F type" manufactured by JEOL Ltd. is captured into a computer. This image is used to recognize a particle using a simple capture tool by using an image analysis device "MacView Ver. 4" manufactured by Mountech Co., Ltd., and the sphericity is determined from a projected area (A) and a perimeter (PM) of the particle. Assuming that the area of a true circle corresponding to the perimeter (PM) is (B), the sphericity of the particle is A/B, and assuming a true circle (radius r) having the same perimeter as the sample perimeter (PM), $PM=2\pi r$, $B=\pi r^2$, so $B=\pi \times (PM/2\pi)^2$ and the sphericity of each particle is as follows: sphericity=$A/B=A\times 4\pi/(PM)^2$. The sphericity of arbitrary 200 particles having a projected area circle equivalent diameter of 0.05 μm or more obtained in this manner is determined, and the average value is defined as an average sphericity.

In the powder mixture of the present invention, particles having a particle diameter of 2 μm or more preferably have an average sphericity of 0.80 or more. The higher the average sphericity of the particles having a particle diameter of 2 μm or more in the powder mixture, the lower the viscosity of the sealing material when filled in a resin, and the wire sweep amount at the time of sealing may be reduced. In addition, an extremely low average sphericity of the particles indicates a large surface unevenness thereof, and the influence of such particles on the wire sweep becomes remarkable. Therefore, it is preferable that the number percentage of particles having a sphericity of more than 0.70 and 0.75 or less is 10.0% or less and the number percentage of particles having a sphericity of 0.70 or less is 10.0% or less. The average sphericity of particles having a particle diameter of 2 μm or more is more preferably 0.83 or more. Further, it is more preferable that the number percentage of particles having a sphericity of more than 0.70 and 0.75 or less is 8.0% or less, and the number percentage of particles having a sphericity of 0.70 or less is 7.0% or less.

The sphericity of the powder mixture of the present invention is measured by the following method. The powder mixture and ethanol are mixed to prepare a slurry containing 1% by mass of the powder mixture, and the slurry is subjected to dispersion treatment for 2 minutes at a power level of 8 using "SONIFIER 450 (crushed horn ¾" solid type)", manufactured by BRANSON. The dispersed slurry is dropped onto a sample table coated with carbon paste by a dropper. After leaving in the atmosphere until the powder mixture dropped on the sample table are dried, osmium coating is applied, and an image having a magnification of 3,000 and a resolution of 2,048×1,536 pixels photographed with a scanning electron microscope "JSM-6301F type" manufactured by JEOL Ltd. is captured into a computer. This image is used to recognize a particle using a simple capture tool by using an image analysis device "MacView Ver. 4" manufactured by Mountech Co., Ltd., and the sphericity is measured from a projected area (A) and a perimeter (PM) of the particle. Assuming that the area of a true circle corresponding to the perimeter (PM) is (B), the sphericity of the particle is A/B, and assuming a true circle (radius r) having the same perimeter as the sample perimeter (PM), $PM=2\pi r$, $B=\pi r^2$, so $B=\pi \times (PM/2\pi)^2$ and the sphericity of each particle is as follows: sphericity=$A/B=A\times 4\pi/(PM)^2$. The sphericity of arbitrary 200 particles having a projected area circle equivalent diameter of 2 μm or more obtained in this manner is determined, and the average value is defined as an average sphericity. Further, the number percentage of particles having a sphericity of more than 0.70 and 0.75 or less and the number percentage of particles having a sphericity of 0.70 or less in these 200 particles are calculated.

The spherical barium titanate particles to be the main constituent particles of the powder mixture of the present invention may be produced by any method, but in order to have the average particle diameter and the sphericity as defined in the present invention, it is preferable that the barium titanate raw material is jetted into the field formed to have a temperature range of the melting point of barium titanate or more to be thereby spheroidized through melting and softening.

The spherical oxide particles contained in the powder mixture of the present invention may be produced by any method as long as they have the average particle diameter of the present invention. For example, in the case of amorphous silicon dioxide particles, a method of injecting metal Si into a high temperature field formed by a chemical flame or an electric furnace to spheroidize the metal Si while causing oxidation reaction, a method of spraying a slurry of metal Si particles into flame to spheroidize the metal Si particles while causing oxidation reaction, a production method of removing metal ions from an alkali metal silicate, such as sodium silicate called colloidal silica, which is used as a raw material, by neutralization or ion exchange, a production method of subjecting alkoxysilane, such as tetraethoxysilane, which is used as a raw material, to hydrolysis and condensation in an organic solvent, or the like, may be mentioned. In the case of aluminum oxide particles, a method of injecting metal Al into a high temperature field formed by a chemical flame or an electric furnace to spheroidize the metal Al while causing oxidation reaction, a method of spraying a slurry of metal Al particles into flame to spheroidize the metal Al particles while causing oxidation reaction, or the like may be mentioned.

The powder mixture of the present invention may be surface-treated as required. Examples of a surface treatment agent therefor include epoxysilanes such as γ-glycidoxypropyltrimethoxysilane and β-(3,4-epoxycyclohexyl)ethyltrimethoxysilane, aminosilanes such as aminopropyltriethoxysilane, ureidopropyltriethoxysilane, and N-phenylaminopropyltrimethoxysilane, hydrophobic silane compounds such as phenyltrimethoxysilane, methyltrimethoxysilane, and octadecyltrimethoxysilane, mercaptosilane, Zr chelates, titanate coupling agents, and aluminum coupling agents.

In the case of preparing a resin composition by using the powder mixture of the present invention, it is not limited to the case where the powder mixture of the present invention is used alone, and for example, the powder mixture of the present invention may be used in combination with an amorphous silica powder or alumina powder having a particle size larger than the spherical oxide particles contained in the powder mixture of the present invention.

With respect to the particles obtained by removing the spherical oxide particles from the powder mixture of the present invention, that is, the spherical barium titanate particles which are sediments of the above-mentioned heavy liquid separation, the main crystal structure is preferably tetragonal in terms of exhibiting high dielectric properties.

EXAMPLES

Hereinafter, the present invention will be described in more detail by way of Examples and Comparative Examples.

Examples 1 to 13 and Comparative Examples 1 to 7

Spherical barium titanate particles were produced using an apparatus in which a LPG-oxygen mixed type burner having a double tube structure capable of forming inner and outer flames at the top of a combustion furnace is installed, and which is directly connected to a collection system line composed of a cyclone and a bag filter at the lower part. The flame formation was performed by injecting a mixed gas of LPG 5 m$^3$/Hr and oxygen 30 m$^3$/Hr from dozen of pores provided at the outlet of the double tube burner, and specifically, a barium titanate raw material having an average particle diameter of 0.5 to 3 μm was injected from the center of the burner at a feed rate of 2 to 5 kg/Hr, together with 1 to 5 m$^3$/Hr of carrier oxygen. Control of the average particle diameter was carried out by adjusting the average particle diameter of the barium titanate raw material. Specifically, in the case of increasing the average particle diameter, the adjustment was made by increasing the diameter of the barium titanate raw material, and in the case of reducing the average particle diameter, the adjustment was made by reducing the diameter of the barium titanate raw material. Control of the average sphericity was carried out by adjusting the feed rate of the barium titanate raw material. In the case of increasing the sphericity, the adjustment was made by decreasing the feed rate of the barium titanate raw material, and in the case of decreasing the sphericity, the adjustment was made by increasing the feed rate of the barium titanate raw material. Control of the number percentage of particles having a sphericity of more than 0.70 and 0.75 or less and the number percentage of particles having a sphericity of 0.70 or less was carried out by adjusting the carrier oxygen which is to be injected together with the barium titanate raw material. Specifically, in the case of increasing the number percentage of particles having low sphericity, the adjustment was made by decreasing the amount of the carrier oxygen, and in the case of reducing the number percentage of particles having low sphericity, the adjustment was made by increasing the amount of the carrier oxygen. In this test, spherical barium titanate particles collected from a cyclone collection product were used.

The spherical oxide particles also were produced using an apparatus in which a LPG-oxygen mixed type burner having a double tube structure capable of forming inner and outer flames at the top of a combustion furnace was installed, and which is directly connected to a collection system line composed of a cyclone and a bag filter at the lower part. A two-fluid nozzle for slurry spraying is further installed at the center of the above-mentioned burner, and a slurry composed of metal Si powder (average particle diameter 25 μm) or metal Al powder (average particle diameter 25 μm) and methanol was injected from the center at a feed amount of 10 L/Hr. Oxygen was supplied from the outer peripheral portion of the two-fluid nozzle. The flame formation was carried out by injecting a mixed gas of LPG and oxygen from dozen of pores provided at the outlet of the double tube burner. Thus, spherical oxide particles generated by passing the slurry injected from the two-fluid nozzle through the flame were subjected to air-transport through the collection line by a blower and then collected by a bag filter. In addition, the adjustment of the average particle diameter of the spherical oxide particles was performed by adjusting the amount of LPG in the range of 1 m$^3$/Hr to 15 m$^3$/Hr, and the metal Si or metal Al concentration of the metal Si powder or metal Al powder/methanol slurry in the range of 10 to 70% by mass. Specifically, in the case of increasing the average particle diameter, the adjustment was made by reducing the amount of LPG and increasing the metal Si or metal Al concentration of the meal Si powder or metal Al powder/methanol slurry, and in the case of reducing the average particle diameter, the adjustment was made by increasing the amount of LPG and decreasing the metal Si or metal Al concentration of the meal Si powder or metal Al powder/methanol slurry.

The thus-obtained silica spherical barium titanate particles and spherical oxide particles were blended in various proportions to produce powder mixtures (A) to (T). The physical properties of the powder mixtures are shown in Table 1 and Table 2.

In order to evaluate the properties of the produced powder mixture in terms of a sealing material, 156 g of a biphenyl type epoxy resin (YX-400011 manufactured by Mitsubishi Chemical Corporation) as an epoxy resin, 136 g of a phenol aralkyl resin (Mirex XLC-4L manufactured by Mitsui Chemicals, Inc.) as a phenol resin, 10 g of epoxysilane (KBM-403 manufactured by Shin-Etsu Chemical Co., Ltd.) as a coupling agent, 6 g of triphenylphosphine (TPP manufactured by Hokko Chemical Industry Co., Ltd.) as a curing accelerator, and 7 g of wax (Licowax-E manufactured by Clariant International Ltd.) as a release agent were added to 2,685 g of the powder mixture, and dry blended at 1,000 rpm for 1 minute in a Henschel mixer ("FM-10B type" manufactured by Mitsui Miike Chemical Engineering Machinery). Thereafter, the mixture was heated and kneaded with a co-rotating intermeshing twin-screw extruder (screw diameter: D=25 mm, L/D=10.2, rotation number of paddle: 60 to 130 rpm, discharge amount: 3.0 kg/Hr, temperature of the mixture being kneaded: 98 to 100° C.). The kneaded material (discharged material) was pressed by a press machine to be cooled, and then pulverized to produce a sealing material. The wire sweep amount, the burr length, and the relative permittivity were evaluated according to the following conditions. The results are shown in Table 3 and Table 4.

(1) Wire Sweep Amount

A TEG chip having a size of 8 mm×8 mm×0.3 mm was placed on a BGA substrate via a die attach film, and connected with 8 positions of the BGA substrate through gold wires. Thereafter, the TEG chip was sealed with each of the above sealing materials by a transfer molding machine to form a molded body having a package size of 38 mm×38 mm×1.0 mm, and then the molded body was post-cured to prepare a simulated chip sealing body. With respect to each of the above sealing materials, 20 simulated chip sealing bodies were prepared. With respect to the gold wires, the diameter was 20 μmφ, the pitch was 80 μm, and the interval was 60 μm. The transfer molding conditions were a mold temperature of 175° C., a molding pressure of 7.5 MPa, a dwelling time of 90 seconds, and a post cure condition of 175° C. for 8 hours. For these 20 simulated chip sealing bodies, the gold wire portions were observed with a soft X-ray transmitting device, the maximum distance among the distances of sweeping of the gold wires by packaging was determined for each sealing body, and the average value of the maximum sweep distances of the gold wires of the 20 sealing bodies was taken as the wire sweep amount. The smaller wire sweep amount value was, the lower the viscosity was. Specifically, it is preferable that the wire sweep amount is less than 35 μm.

(2) Burr Length

Each of the above sealing material was molded at a molding temperature of 175° C. and a molding pressure of 7.5 MPa with a mold for burr measurement, which had a slit width of 2 μm or 5 μm, and the sealing material flowed into the slit was measured with a caliper, and thus, the burr length with respect to each slit width was measured. It is preferable that the average of the values of the burr length measured with respect to the respective slit widths is less than 4.0 mm (3) Relative Permittivity Each sealing material was molded into a circular shape having a diameter of 100 mm and a thickness of 3 mm using a transfer molding machine, and post curing was performed to produce a cured body of the sealing material. The transfer molding conditions were set to a mold temperature of 175° C., a molding pressure of 7.5 MPa, and a dwelling time of 90 seconds, and the post-cure conditions were set to 175° C. for 8 hours. A conductive paste "Dotite D-550" manufactured by Fujikura Kasei Co., Ltd. was thinly applied onto the surface of the cured body of the sealing material, and the relative permittivity was calculated from the capacitance measured at a temperature of 20° C., a humidity of 40% and a frequency of 1 MHz by using LCR meter "HP4284A" manufactured by Agilent Technologies, Inc. and measuring electrode "SE-70" manufactured by Ando Electric Co., Ltd. The larger the value of the relative permittivity was, the better the dielectric property was. It is preferable that the value of this relative permittivity is 55 or more.

TABLE 1

| | | | Example No. | | | | | | |
|---|---|---|---|---|---|---|---|---|---|
| | | | 1 | 2 | 3 | 4 | 5 | 6 | 7 |
| Powder mixture | | | A | B | C | D | E | F | G |
| Properties of Powder mixture | Average particle diameter (μm) | | 4 | 3 | 2 | 30 | 10 | 25 | 20 |
| | Spherical oxide particles | Average particle diameter (μm) | 0.5 | 0.07 | 0.1 | 1.0 | 0.05 | 1.5 | 1.3 |
| | | Content (% by mass) | 2 | 0.08 | 10 | 5 | 14 | 0.05 | 0.02 |
| | | Composition | Amorphous silicon dioxide | Amorphous silicon dioxide | Aluminum oxide | Aluminum oxide | Amorphous silicon dioxide | Amorphous silicon dioxide | Amorphous silicon dioxide |
| | | Average sphericity of particles having particle diameter of 0.05 μm or more (—) | 0.92 | 0.87 | 0.90 | 0.93 | 0.85 | 0.94 | 0.92 |
| | Sphericity of particles having particle diameter of 2 μm or more | Average sphericity (—) | 0.85 | 0.84 | 0.83 | 0.83 | 0.83 | 0.82 | 0.81 |
| | | Number percentage of particles having sphericity of more than 0.70 and 0.75 or less (%) | 7.5 | 8.0 | 8.5 | 8.0 | 8.5 | 8.5 | 9.5 |
| | | Number percentage of particles having sphericity of 0.70 or less (%) | 7.0 | 6.5 | 7.0 | 7.5 | 6.5 | 6.5 | 9.0 |

| | | | Example No. | | | | | |
|---|---|---|---|---|---|---|---|---|
| | | | 8 | 9 | 10 | 11 | 12 | 13 |
| Powder mixture | | | H | I | J | K | L | M |
| Properties of Powder mixture | Average particle diameter (μm) | | 28 | 26 | 3 | 2 | 21 | 28 |
| | Spherical oxide particles | Average particle diameter (μm) | 1.2 | 1.1 | 0.06 | 0.09 | 1.4 | 1.4 |
| | | Content (% by mass) | 15 | 7 | 0.04 | 0.07 | 11 | 0.04 |
| | | Composition | Aluminum oxide | Aluminum oxide | Amorphous silicon dioxide | Amorphous silicon dioxide | Aluminum oxide | Amorphous silicon dioxide |
| | | Average sphericity of particles having particle diameter of 0.05 μm or more (—) | 0.92 | 0.91 | 0.86 | 0.87 | 0.92 | 0.93 |

TABLE 1-continued

|  |  |  | | | | | |
|---|---|---|---|---|---|---|---|
| Sphericity of particles having particle diameter of 2 μm or more | Average sphericity (—) | 0.82 | 0.80 | 0.80 | 0.81 | 0.79 | 0.80 |
| | Number percentage of particles having sphericity of more than 0.70 and 0.75 or less (%) | 8.0 | 9.0 | 10.0 | 9.5 | 9.0 | 10.5 |
| | Number percentage of particles having sphericity of 0.70 or less (%) | 9.0 | 8.5 | 7.0 | 10.0 | 9.0 | 10.5 |

TABLE 2

|  |  |  | Comparative Example No. | | | | | | |
|---|---|---|---|---|---|---|---|---|---|
|  |  |  | 1 | 2 | 3 | 4 | 5 | 6 | 7 |
| Powder mixture | | | N | O | P | Q | R | S | T |
| Properties of powder mixture | Average particle diameter (μm) | | 31 | 1 | 3 | 18 | 27 | 2 | 32 |
| | Spherical oxide particles | Average particle diameter (μm) | 1.0 | 0.07 | 0.04 | 1.6 | 1.5 | 0.05 | 1.7 |
| | | Content (% by mass) | 12 | 8 | 0.04 | 0.02 | 16 | 0.01 | 15 |
| | | Composition | Aluminum oxide | Aluminum oxide | Amorphous silicon dioxide | Amorphous silicon dioxide | Amorphous silicon dioxide | Amorphous silicon dioxide | Aluminum oxide |
| | | Average sphericity of particles having particle diameter of 0.05 μm or more (—) | 0.92 | 0.86 | 0.85 | 0.93 | 0.93 | 0.86 | 0.94 |
| | Sphericity of particles having particle diameter of 2 μm or more | Average sphericity (—) | 0.83 | 0.81 | 0.80 | 0.79 | 0.82 | 0.79 | 0.78 |
| | | Number percentage of particles having sphericity of more than 0.70 and 0.75 or less (%) | 9.5 | 9.0 | 10.5 | 10.0 | 8.0 | 10.5 | 10.0 |
| | | Number percentage of particles having sphericity of 0.70 or less (%) | 8.0 | 10.5 | 10.0 | 9.5 | 8.0 | 9.5 | 11.0 |

TABLE 3

|  |  |  | Example No. | | | | | | | | | | | | |
|---|---|---|---|---|---|---|---|---|---|---|---|---|---|---|---|
|  |  |  | 1 | 2 | 3 | 4 | 5 | 6 | 7 | 8 | 9 | 10 | 11 | 12 | 13 |
| Powder mixture | | | A | B | C | D | E | F | G | H | I | J | K | L | M |
| Properties of sealing material | Wire sweep amount (μm) | | 17 | 21 | 25 | 24 | 29 | 22 | 24 | 28 | 29 | 28 | 27 | 31 | 32 |
| | Burr length (mm) | Slit width 2 μm | 2.3 | 2.2 | 2.2 | 2.4 | 2.5 | 3.6 | 3.5 | 2.9 | 3.0 | 3.3 | 3.1 | 3.2 | 3.9 |
| | | Slit width 5 μm | 2.0 | 2.3 | 2.5 | 2.0 | 2.0 | 3.0 | 3.3 | 2.5 | 2.5 | 3.0 | 2.3 | 2.8 | 3.4 |
| | | Average | 2.2 | 2.3 | 2.4 | 2.2 | 2.3 | 3.3 | 3.4 | 2.7 | 2.8 | 3.2 | 2.7 | 3.0 | 3.7 |
| | Relative permittivity (—) | | 63 | 62 | 58 | 60 | 55 | 61 | 63 | 57 | 58 | 61 | 62 | 56 | 62 |

TABLE 4

|  |  |  | Comparative Example No. | | | | | | |
|---|---|---|---|---|---|---|---|---|---|
|  |  |  | 1 | 2 | 3 | 4 | 5 | 6 | 7 |
| Powder mixture | | | N | O | P | Q | R | S | T |
| Properties of sealing material | Wire sweep amount (μm) | | 36 | 38 | 37 | 26 | 36 | 39 | 43 |
| | Burr length (mm) | Slit width 2 μm | 2.5 | 2.3 | 2.8 | 5.4 | 2.9 | 4.3 | 4.2 |
| | | Slit width 5 μm | 2.0 | 2.5 | 2.7 | 4.0 | 2.5 | 4.1 | 3.8 |
| | | Average | 2.3 | 2.4 | 2.8 | 4.7 | 2.7 | 4.2 | 4.0 |
| | Relative permittivity (—) | | 58 | 59 | 60 | 62 | 52 | 62 | 55 |

As is clear from the comparison between Examples and Comparative Examples, according to the present invention, a powder mixture suitable for preparing a resin composition exhibiting a reduced wire sweep amount and a reduced burr was obtained. In addition, when used for a sealing material for fingerprint sensor protection, the resulting relative permittivity was from 55 to 63. When spherical silica and spherical alumina generally used for the sealing material were evaluated in the same formulation, the relative permittivity of the sealing material containing spherical silica filled therein was from 3 to 4, and the relative permittivity of the sealing material containing spherical alumina filled therein was from 6 to 7, and therefore the powder mixture of the present invention was able to obtain excellent properties for the preparation of a sealing material for fingerprint sensor protection.

INDUSTRIAL APPLICABILITY

The powder mixture of the present invention is used as a preparation of a sealing material for protecting a fingerprint authentication sensor used in a mobile terminal or the like represented by a smartphone or a tablet.

The invention claimed is:

1. A powder mixture comprising spherical barium titanate particles and spherical amorphous silicon dioxide particles, the powder mixture having an average particle diameter of 2 μm or more and 30 μm or less, wherein the spherical amorphous silicon dioxide particles have an average particle diameter of 0.05 μm or more and 1.5 μm or less, and are contained in an amount of 0.02% by mass or more and 15% by mass or less based on the powder mixture.

2. The powder mixture according to claim 1, wherein particles having a particle diameter of 2 μm or more contained in the powder mixture satisfy the following conditions (A) to (C):
 (A) an average sphericity is 0.80 or more;
 (B) the number percentage of particles having a sphericity of more than 0.70 and 0.75 or less is 10.0% or less; and
 (C) the number percentage of particles having a sphericity of 0.70 or less is 10.0% or less.

* * * * *